(12) United States Patent
Kim et al.

(10) Patent No.: US 7,675,779 B2
(45) Date of Patent: Mar. 9, 2010

(54) NON-VOLATILE MEMORY DEVICES AND METHODS OF OPERATING THE SAME

(75) Inventors: Won-joo Kim, Hwaseong-si (KR); Yoon-dong Park, Yongin-si (KR); Seung-hoon Lee, Seoul (KR); Suk-pil Kim, Yongin-si (KR); Jae-woong Hyun, Uijeongbu-si (KR); Jung-hun Sung, Yongin-si (KR); Tae-hee Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 12/010,490

(22) Filed: Jan. 25, 2008

(65) Prior Publication Data

US 2008/0259688 A1  Oct. 23, 2008

(30) Foreign Application Priority Data

Apr. 19, 2007  (KR) ...................... 10-2007-0038387

(51) Int. Cl.
*G11C 16/06* (2006.01)
(52) U.S. Cl. .............................. 365/185.17; 365/185.13; 365/185.16; 365/185.26
(58) Field of Classification Search ............ 365/185.17, 365/185.13, 185.16, 185.26
See application file for complete search history.

(56) References Cited

U.S. PATENT DOCUMENTS

2007/0140013 A1*  6/2007  Kwon et al. ........... 365/185.17
2007/0205445 A1*  9/2007  Park et al. .................. 257/288

FOREIGN PATENT DOCUMENTS

| KR | 100673020 | 1/2007 |
|---|---|---|
| WO | WO 2005/078733 | 8/2005 |
| WO | WO 2006/124525 | 11/2006 |

\* cited by examiner

*Primary Examiner*—Thong Q Le
(74) *Attorney, Agent, or Firm*—Harness, Dickey & Pierce, P.L.C.

(57) ABSTRACT

A non-volatile memory device includes memory transistors disposed on a semiconductor substrate in a NAND string. A string select transistor is disposed at a first end of the NAND string, and a ground select transistor is disposed at a second end of the NAN string. Bit lines are electrically connected to the semiconductor substrate outside of the string select transistor and a gate electrode of the ground select transistor.

31 Claims, 7 Drawing Sheets

NON-VOLATILE MEMORY DEVICES AND METHODS OF OPERATING THE SAME

PRIORITY STATEMENT

This application claims priority under 45 U.S.C. §119 to Korean Patent Application No. 10-2007-0038387, filed on Apr. 19, 2007, in the Korean Intellectual Property Office, the entire contents of which is incorporated herein by reference.

BACKGROUND

Description of the Related Art

Conventional NAND-type non-volatile memory devices may include memory transistors arranged in NAND strings. In such an arrangement, word lines may traverse the NAND strings and be coupled to the memory transistors. In such a conventional NAND-type non-volatile memory device, programming of data into memory transistors disposed on unselected NAND strings is undesirable.

Conventional channel boosting may decrease a program potential applied to memory transistors by applying a boosting voltage to channels of unselected NAND strings. But, boosting voltage may also damage memory transistors located on outermost sides of the non-volatile memory devices. The resultant damage may degrade operational reliability. Hot carriers produced by a gate induced drain leakage (GIDL) may also disturb the memory transistors. As a result, program and pass windows of the memory transistors may decrease, and short channel effects may occur during a reading operation.

SUMMARY

Example embodiments relate to semiconductor devices, for example, non-volatile memory devices and methods of operating the same. Non-volatile memory devices and methods of operating the same may operate more reliably without using channel boosting.

According to at least one example embodiment, a non-volatile memory device may include a plurality of memory transistors arranged on a semiconductor substrate in a NAND string. A string select transistor and a ground select transistor may be disposed in the semiconductor substrate at respective ends of the NAND string. A bit line may be electrically connected to the semiconductor substrate and a gate electrode of the ground select transistor.

According to at least one example embodiment, a non-volatile memory device at least one NAND string structure. The at least one NAND string structure may include a NAND string, a string select transistor and a ground select transistor. The NAND string may include a plurality of memory transistors arranged on a semiconductor substrate. The string select transistor may be disposed on the semiconductor substrate at a first end of the NAND string. The ground select transistor may be disposed on the semiconductor substrate at a second end of the NAND string. A bit line may be electrically connected to the semiconductor substrate and a gate electrode of the ground select transistor.

According to at least some example embodiments, the bit line may be connected to first source and drain regions formed by doping impurities into the semiconductor substrate disposed outside of the string select transistor. A second source and drain region may be defined in the semiconductor substrate between each of the plurality of memory transistors. The second source and drain regions may be formed by an electrical field effect caused by fringe fields. Second source and drain regions may also be defined between the NAND structure and the ground select transistors.

At least one other example embodiment provides a non-volatile memory device including a plurality of bit lines and a plurality of word lines on a semiconductor substrate. A plurality of memory transistors, a plurality of select transistors and a plurality of ground select transistors may be coupled to the plurality of bit lines and the plurality of word lines in a NAND array string structure. Each of the plurality of bit lines may be electrically connected to the semiconductor substrate disposed outside of the plurality of select transistors and each gate electrode of the plurality of ground select transistors.

At least one other example embodiment provides a method of operating a non-volatile memory device including storing data on at least one of the plurality of memory transistors by turning-off the string select transistor, and applying an operation voltage to the bit line to turn-on the ground select transistor.

According to at least some example embodiments, the method may further include reading of data stored in the plurality of memory transistors by turning-on the string select transistor, and applying an operation voltage to the bit lines to turn-on the ground select transistor. Data stored in the plurality of memory transistors may be erased by grounding at least one of control gate electrodes of the plurality of memory transistors and applying an erase voltage to the semiconductor substrate.

According to at least some example embodiments, storage of data in the memory transistors may be prevented by turning-off the string select transistor, and grounding the bit lines to turn-off the ground select transistor.

According to at least one example embodiment, a method of operating a non-volatile memory device may include storing data on at least one of a plurality of memory transistors by turning-off a string select transistor, and applying an operating voltage to a bit line to turn-on the a ground select transistor. The plurality of memory transistors may be arranged in a NAND string on a semiconductor substrate. The NAND string may be part of the NAND string structure. The string select transistor may be disposed on the semiconductor substrate at a first end of the NAND string, the ground select transistor may be disposed on the semiconductor substrate at a second end of the NAND string, and the bit line may be electrically connected to the semiconductor substrate and a gate electrode of the ground select transistor.

According to at least one example embodiment, a method of operating a non-volatile memory device may include preventing, when storing the data, storage of data in at least one of a plurality of memory transistors by turning-off a string select transistor, and grounding bit lines to turn-off a ground select transistor. The plurality of memory transistors may be arranged in a NAND string on a semiconductor substrate. The NAND string may be part of the NAND string structure. The string select transistor may be disposed on the semiconductor substrate at a first end of the NAND string, the ground select transistor may be disposed on the semiconductor substrate at a second end of the NAND string, and the bit line may be electrically connected to the semiconductor substrate and a gate electrode of the ground select transistor.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
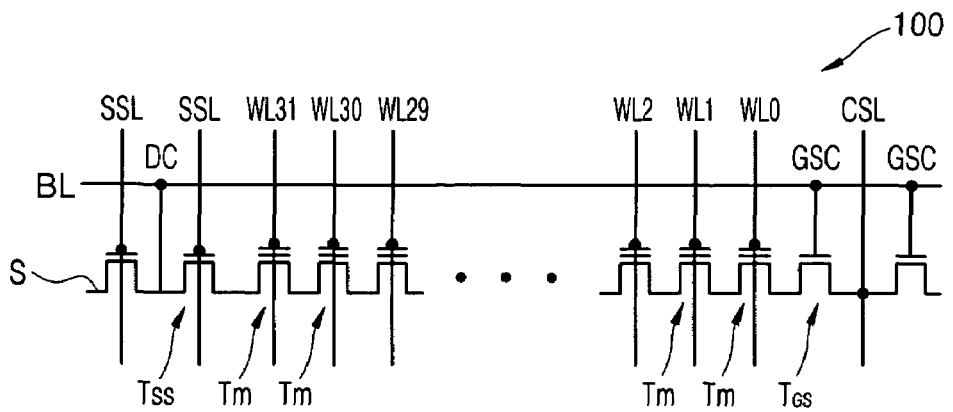
FIG. 1 is a circuit diagram illustrating a non-volatile memory device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram illustrating a non-volatile memory device according to an example embodiment.

Referring to FIG. 1, an example embodiment of a non-volatile memory device 100 may have a NAND structure, but example embodiments are not limited thereto. In this example NAND structure, a plurality of memory transistors Tm may be arranged in a NAND string S. String select transistor $T_{SS}$ may be connected to a first end of the NAND string S, and a ground select transistor $T_{GS}$ may be connected to a second end of the NAND string S. The first and the second ends may be opposite to one another. The string select transistor $T_{SS}$, the memory transistors Tm and the ground select transistor $T_{GS}$ may be sequentially connected in series.

A bit line BL may be arranged along an extension direction of the NAND string S. The bitline BL may be connected to the NAND string S outside of the string select transistor $T_{SS}$. The bit line BL may also be connected to a gate electrode of the ground select transistor $T_{GS}$. In at least one example embodiment, the bit line BL may be connected to the NAND string S using a first contact plug DC. The bit line BL may be connected to the gate electrode of the ground select transistor $T_{GS}$ using a second contact plug GSC.

Each of a plurality of word lines WL0, WL1, WL2, ..., WL29, WL30, and WL31 may be electrically connected to a control gate electrode of a corresponding memory transistor Tm. The numbers of memory transistors Tm and word lines WL0, WL1, WL2, ..., WL29, WL30, and WL31 shown in FIG. 1 are shown for example purposes. But, example embodiments are not limited thereto.

The string select lines SSL may be connected to a gate electrode of the string select transistor $T_{SS}$. A common source line CSL may be electrically connected to the NAND string S outside the ground select transistor $T_{GS}$. Unlike conventional NAND structures, in at least this example embodiment the ground select transistor $T_{GS}$ may be connected to the bit line BL without being coupled to a separate ground select line (not shown).

Figure 2:
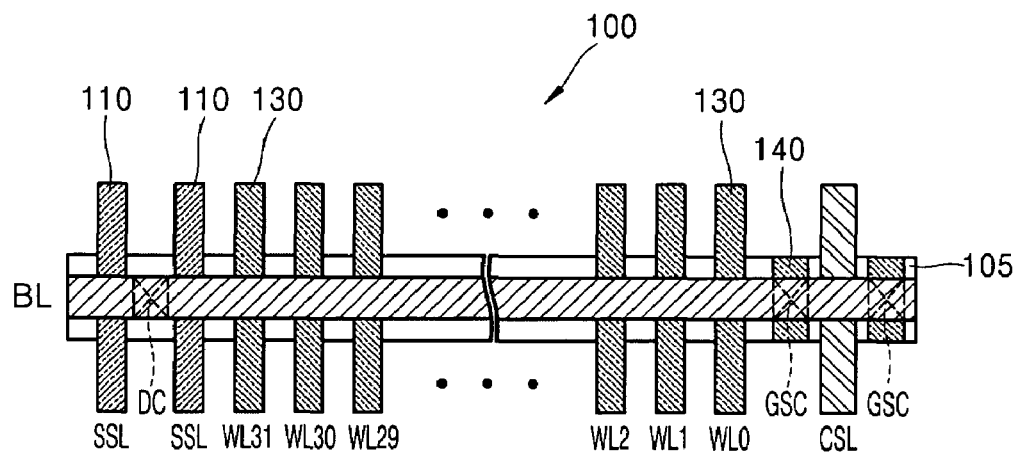
FIG. 2 is a plan view of the non-volatile memory device of FIG. 1.
Figure 3:
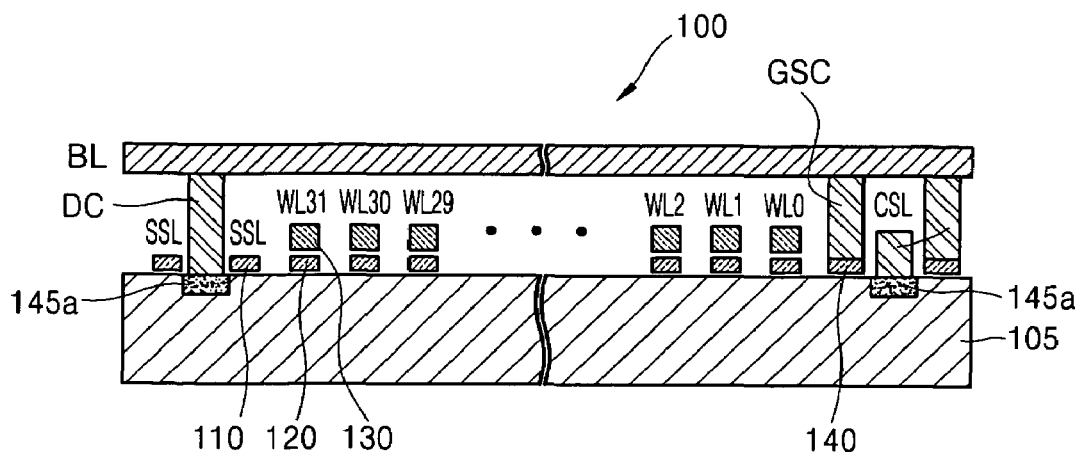
FIG. 3 is a sectional view of the non-volatile memory device of FIG. 2 viewed in a bit line direction.

FIG. 2 is a plan view illustrating the non-volatile memory device of FIG. 1. FIG. 3 is a sectional view illustrating the non-volatile memory device of FIG. 2 viewed from a bit line direction. The structures illustrated in FIGS. 2 and 3 may correspond to the circuit of FIG. 1.

Referring to FIGS. 2 and 3, the NAND string S of FIG. 1 may correspond to a semiconductor substrate 105. For example, a portion of the semiconductor substrate 105 may be provided as a conductive path for charges. The semiconductor substrate 105 may be comprised of, for example, silicon, germanium, silicon-germanium or the like. In at least this example embodiment, the semiconductor substrate 105 may include an active region, around which a device isolating film (not shown) may be arranged.

The memory transistors Tm of FIG. 1 may have a stack structure of charge storage layers 120 and control gate electrodes 130 on the semiconductor substrate 105. In at least one example embodiment, blocking insulating layers (not shown) may be interposed between the control gate electrodes 130 the charge storage layers 120. The charge storage layer 120 may be used as a floating gate layer or a charge trap layer. A tunneling insulating layer (not shown) may be interposed between the semiconductor substrate 105 and the charge storage layer 120. According to at least one example embodiment, the control gate electrodes 130 may be used as portions of the word lines WL0, WL1, WL2, . . . , WL29, WL30, and WL31.

The string select transistor $T_{SS}$ of FIG. 1 may include a first gate electrode 110 on the semiconductor substrate 105. For example, the first gate electrode 110 may be used as a portion of the string select line SSL. The ground select transistor $T_{GS}$ of FIG. 1 may include a second gate electrode 140 on the semiconductor substrate 105. The second gate electrode 140 may be defined within the semiconductor substrate 105, for example, a single NAND string S of FIG. 1, without having a line form or arrangement. According to at least one example embodiment, the string select transistor $T_{SS}$ and the ground select transistor $T_{GS}$ may have a MOS transistor structure.

Referring to the sectional view shown in FIG. 3, the bit line BL may be connected to first source and drain regions 145a disposed outside of the first gate electrode 110 using a first contact plug DC. The bitline BL may be connected to the second gate electrode 140 using a second contact plug GSC. A common source line CSL may be electrically connected to the first source and drain regions 145a disposed outside of the second gate electrode 140.

The first source and drain regions 145a may be formed by doping the semiconductor substrate 105 with impurities. For example, if the semiconductor substrate 105 has a first conductivity type, the first source and drain regions 145a may be doped with impurities of a second conductivity type. The second conductivity type may be different from (e.g., opposite to) the first conductivity type. The first and second conductivity types may be n-type and p-type, respectively, but may be interchangeable as desired. The first source and drain regions 145a may form a diode junction with the semiconductor substrate 105.

In at least this example embodiment, the first source and drain regions 145a may be defined at each end of the semiconductor substrate 105. For example, the first source and drain regions 145a may be disposed outside of the first gate electrode 110 and the second gate electrode 140. Accordingly, the first source and drain regions 145a may not be defined in the semiconductor substrate 105 between the control gate electrodes 130, between the control gate electrodes 130 and the first gate electrode 110, and/or between the control gate electrodes 130 and the second gate electrode 140. Instead, the first source and drain regions 145a may be defined locally as described above, so that the control gate electrodes 130 may be disposed more compactly, which may increase integration of the non-volatile memory device 100.

Example operational characteristics of the non-volatile memory device 100 will be described with reference to FIGS. 4 and 5.

Figure 4:
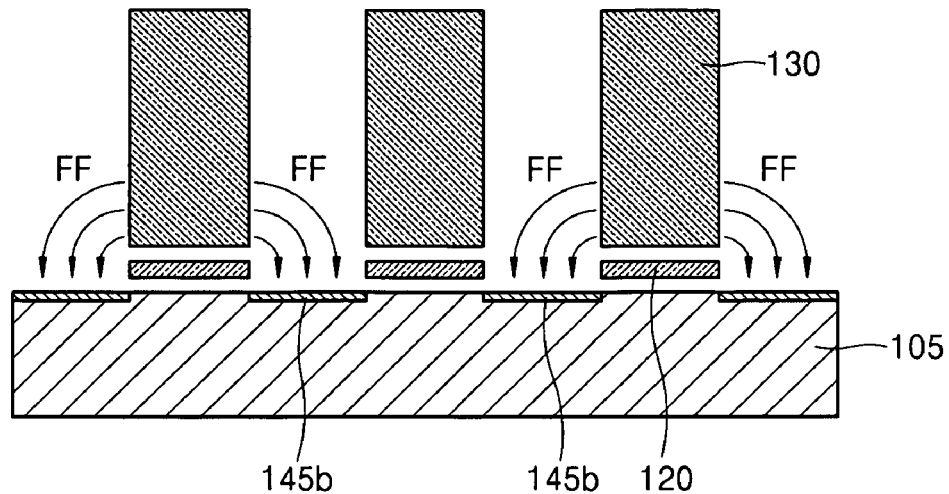
FIG. 4 is a partially enlarged sectional view for illustrating operational characteristics of the non-volatile memory device of FIG. 3.

Referring to FIG. 4, during programming and/or reading of the non-volatile memory device 100, second source and drain regions 145b may be formed in the semiconductor substrate 105 between the control gate electrodes 130. The second source and drain regions 145b may be formed by fringe fields FF. The fringe fields FF may be formed by a voltage applied to the control gate electrodes 130. For example, the second source and drain regions 145b may be inversion layers formed by an electrical field effect, which may be similar or substantially similar to channels.

Accordingly, the second source and drain regions 145b may be formed when the voltage is applied to the control gate electrodes 130. As a result, the second source and drain regions 145b may be distinguished from the first source and drain regions 145a formed by impurity doping. In one example, the second source and drain regions 145b may be formed by an electrical field effect as described in Korean Registered Patent No. 0673020, the entire contents of which are incorporated herein by reference.

The second source and drain regions 145b may be formed in the semiconductor substrate 105 between the control gate electrodes 130 and the first gate electrode 110, and between the control gate electrodes 130 and the second gate electrode 140. The second source and drain regions 145b may serve as a conductive path of charges when programming and/or reading from the non-volatile memory device 100.

Figure 5:
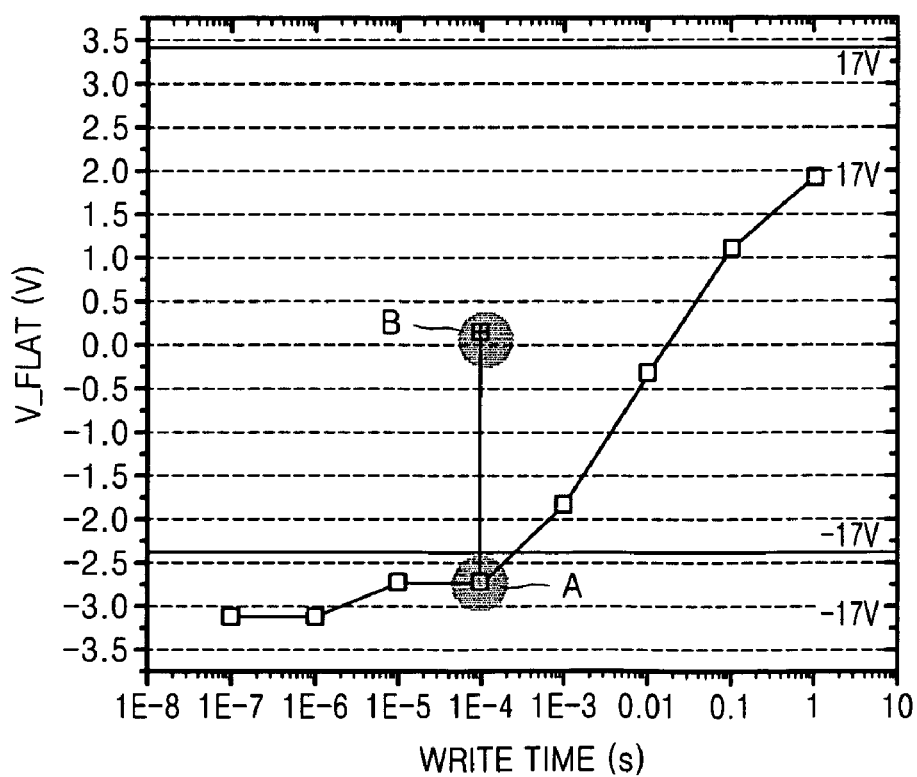
FIG. 5 is a graph illustrating programming characteristics of the non-volatile memory device according to an example embodiment.

Referring to FIG. 5, a difference in programming characteristics when the second source and drain regions 145b involve no free electron (case A), and when the second source and drain regions 1445b involve free electrons (case B) is shown. A non-volatile memory device having a NAND structure may use a step pulse program method. In one example, a step pulse may have a maintenance time of between about 15 μs and about 20 μs, inclusive.

Referring to case (A) in FIG. 5, without free electrons, a flat band voltage V_FLAT may be changed relatively little (e.g., scarcely changed) until reaching a write time of about 100 μs. In case (B), upon reaching a write time of about 100 μs, a flat band voltage V_FLAT may be at least about 5V different than in case (A). The change of the flat band voltage V_FLAT denotes a variation of a threshold voltage, which may affect whether programming is performed or not. Therefore, when using a step pulse program having a write time of between about 15 μs and about 20 μs, inclusive, relatively little programming is performed in case (A) and case (B).

According to example embodiments, programming may be performed when the free electrons are supplied to the second source and drain regions 145b, but suppressed and/or prevented when free electrons are not supplied. As a result, a programming suppression operation may be realized even without supplying a relatively high channel boosting voltage.

For example, referring back to FIGS. 1 through 3, when selecting the NAND string S to perform data programming on the memory transistors Tm, the ground select transistor $T_{GS}$ may be turned-on (e.g., activated), so that free electrons may be supplied from the common source line CSL to the second source and drain regions 145b. To suppress and/or prevent programming of data to the memory transistors Tm, both the string select transistor $T_{SS}$ and the ground select transistor $T_{GS}$ may be turned-off (e.g., deactivated) to suppress and/or inhibit intrusion of free electrons into the second source and drain regions 145b.

Consequently, the non-volatile memory device 100 according to example embodiments may embody the programming suppression operation without utilizing channel boosting. The non-volatile memory device 100 according to example embodiments may suppress and/or prevent damage of, for example, the outermost memory transistors Tm, which may improve (e.g., secure) programming and/or reading windows and suppress (e.g., inhibit) short channel effects. Therefore, reliability of the non-volatile memory device may improve.

Figure 6:
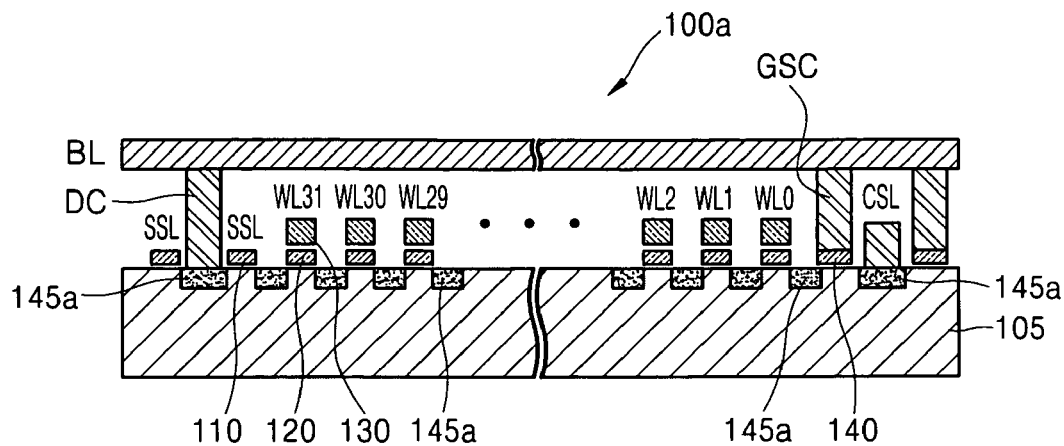
FIG. 6 is a sectional view illustrating a modified version of the example non-volatile memory device of FIG. 3.

FIG. 6 is a sectional view illustrating a non-volatile memory device according to another example embodiment.

Referring to FIG. 6, the non-volatile memory device 100a may be similar or substantially similar to the non-volatile memory device 100 of FIG. 3, but may further include impurity-doped first source and drain regions 145a instead of the second source and drain regions 145b of FIG. 3. A programming suppression operation may be performed so that semiconductor substrate 105 between a bit line BL and a common source line CSL may be floated by turning-off (e.g., deactivating) both a string select transistor $T_{SS}$ and a ground select transistor $T_{GS}$. However, efficiency of the programming suppression of the non-volatile memory device 100 described with reference to FIGS. 1 through 3 may be higher than that of the non-volatile memory device 100a because the first source and drain regions 145a may supply the free electrons.

Figure 7:
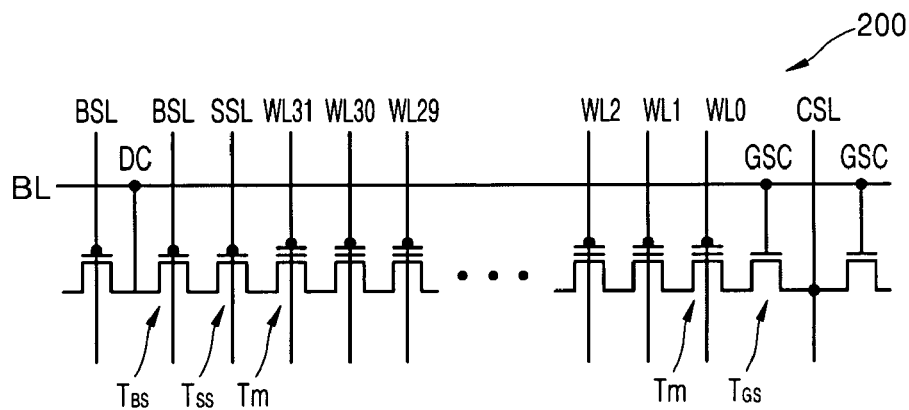
FIG. 7 is a circuit diagram illustrating a non-volatile memory device according to another example embodiment.

FIG. 7 is a circuit diagram illustrating a non-volatile memory device according to another example embodiment. Referring to FIG. 7, a non-volatile memory device 200 may be similar or substantially similar to the non-volatile memory device 100 in FIGS. 1-3, but may further include a block select transistor $T_{BS}$ and block select lines BSL.

Referring to FIG. 7, the block select transistor $T_{BS}$ may be connected to a NAND string S arranged outside of a string select transistor $T_{SS}$. A bit line BL may be connected to one end of the block select transistor $T_{BS}$, and may be further connected to a gate electrode of a ground select transistor $T_{GS}$. The block select line BSL may be connected to a gate electrode of the block select transistor $T_{BS}$ so as to be coupled to the block select transistor $T_{BS}$.

The block select line BSL may be used, for example, when the non-volatile memory device 200 operates in a block unit. Because the string select transistor $T_{SS}$ is turned-off (e.g., deactivated) when programming the non-volatile memory device 200, distinguishing blocks using the string select transistor $T_{SS}$ may be relatively difficult. In this example, the block select transistor $T_{BS}$ of a block to be selected may be turned-on (e.g., activated) to allow for operating in a block unit.

Figure 8:
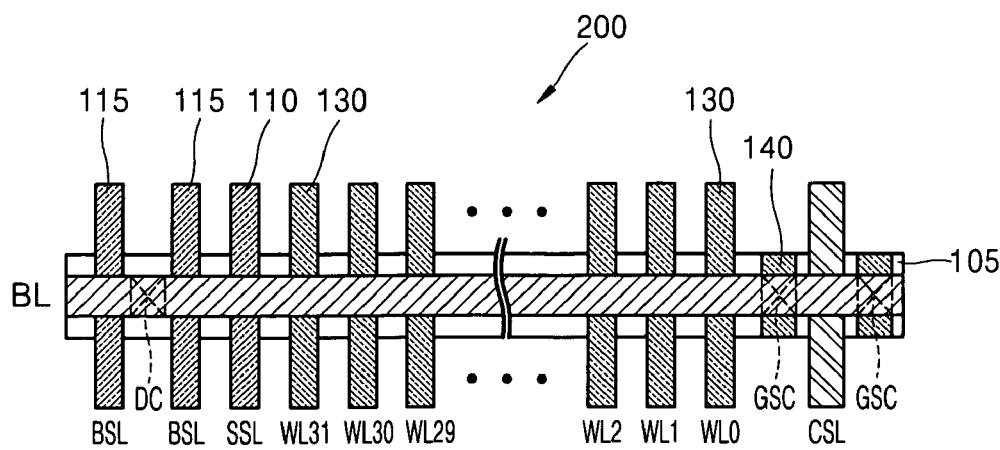
FIG. 8 is a plan view illustrating a non-volatile memory device according to another example embodiment.
Figure 9:
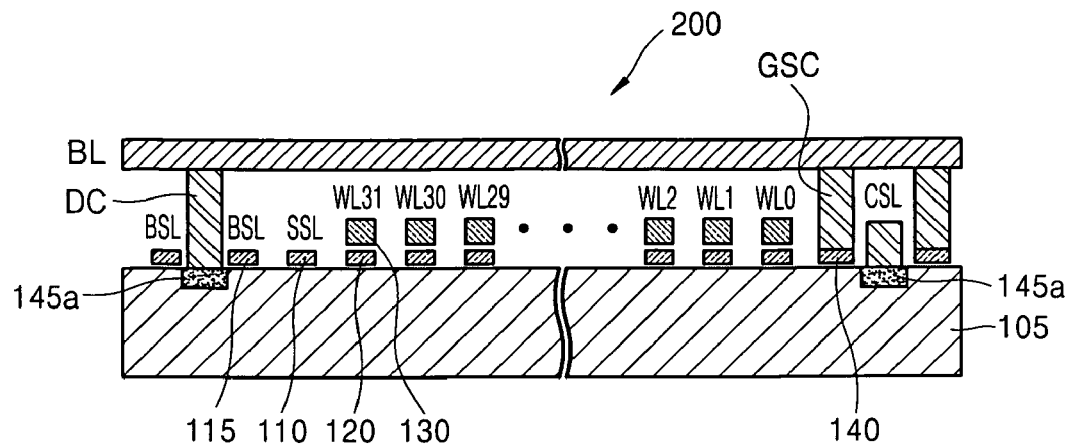
FIG. 9 is a sectional view illustrating the example non-volatile memory device of FIG. 8 viewed from a bit line direction.

FIG. 8 is a plan view illustrating a non-volatile memory device according to another example embodiment. FIG. 9 is a sectional view illustrating the non-volatile memory device 200 of FIG. 8 viewed from a bit line direction. The non-volatile memory device 200 shown in FIGS. 8 and 9 may be similar or substantially similar to the non-volatile memory device 100, but may further include third gate electrodes 115. Accordingly, a detailed description of the components common to the non-volatile memory devices 100 and 200 will be omitted for the sake of brevity.

Referring to FIGS. 8 and 9, a block select transistor $T_{BS}$ in FIG. 7 may include the third gate electrodes 115 on a semiconductor substrate 115. The third gate electrode 115 may be used as a portion of a block select line BSL. The third gate electrode 115 may be disposed between first source and drain regions 145a and a first gate electrode 110. The block select transistor $T_{BS}$ may have a structure similar or substantially similar to those of the string select transistor $T_{SS}$ and the ground select transistor $T_{GS}$.

Figure 10:
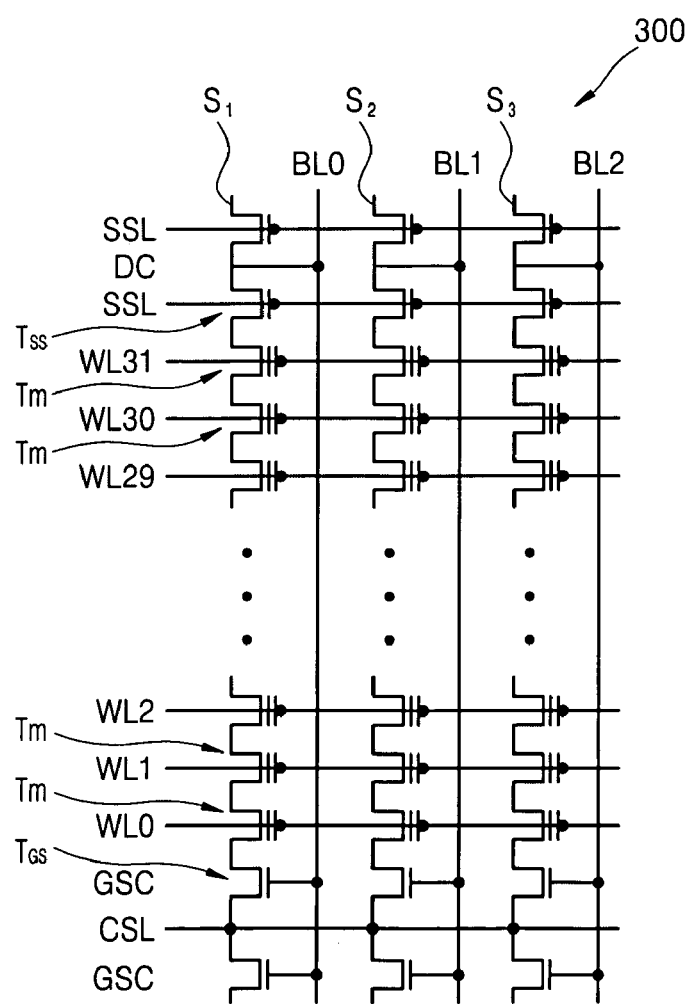
FIG. 10 is a circuit diagram illustrating a non-volatile memory device according to another example embodiment.

FIG. 10 is a circuit diagram illustrating a non-volatile memory device according to another example embodiment. The non-volatile memory device 300 may include a plurality of the non-volatile memory devices 100 of FIG. 1 arranged in a NAND array string structure. Because an example embodiment of a non-volatile memory device 100 has already been described, a repeated description will be omitted for the sake of brevity.

Referring to FIG. 10, a plurality of bit lines BL0, BL1, and BL2 and a plurality of word lines WL0, WL1, WL2, ..., WL29, WL30, and WL31 may be arranged in a matrix. A plurality of memory transistors Tm, a plurality of string select transistors $T_{SS}$, and a plurality of ground select transistors $T_{GS}$ may be coupled to the bit lines BL0, BL1, and BL2 and the word lines WL0, WL1, WL2, ..., WL29, WL30, and WL31 in the NAND array string structure.

Each of the plurality of NAND strings S1, S2, and S3 may correspond to the NAND string S of FIG. 1. A string select line SSL may be commonly shared between the string select transistors $T_{SS}$ arranged in the same row. Similarly, the word lines WL0, WL1, WL2, ..., WL29, WL30, and WL31 may be commonly shared between the memory transistors Tm arranged in the same row. However, gate electrodes of the ground select transistors $T_{GS}$ may each be connected to the bit lines BL0, BL1, and BL2, and electrically isolated from one another. The bit lines BL0, BL1, and BL2 may be further connected to NAND strings S1, S2, and S3.

Planar and sectional structures of the non-volatile memory device 300 may be the same or substantially the same as those shown in FIGS. 2 and 3. Accordingly, the bit lines BL0, BL1, and BL2 and the word lines WL0, WL1, WL2, ..., WL29, WL30, and WL31 may be located on a semiconductor substrate 105 of FIG. 3. Therefore, the arrangement of the first source and drain regions 145a of FIG. 3 and the second source and drain regions 145b of FIG. 4 may be applied to the non-volatile memory device 300.

In another example embodiment, the NAND strings S1, S2, and S3 may be modified as the NAND string S of FIG. 7 to include the block select transistor $T_{BS}$ and the block select line BSL.

Figure 11:
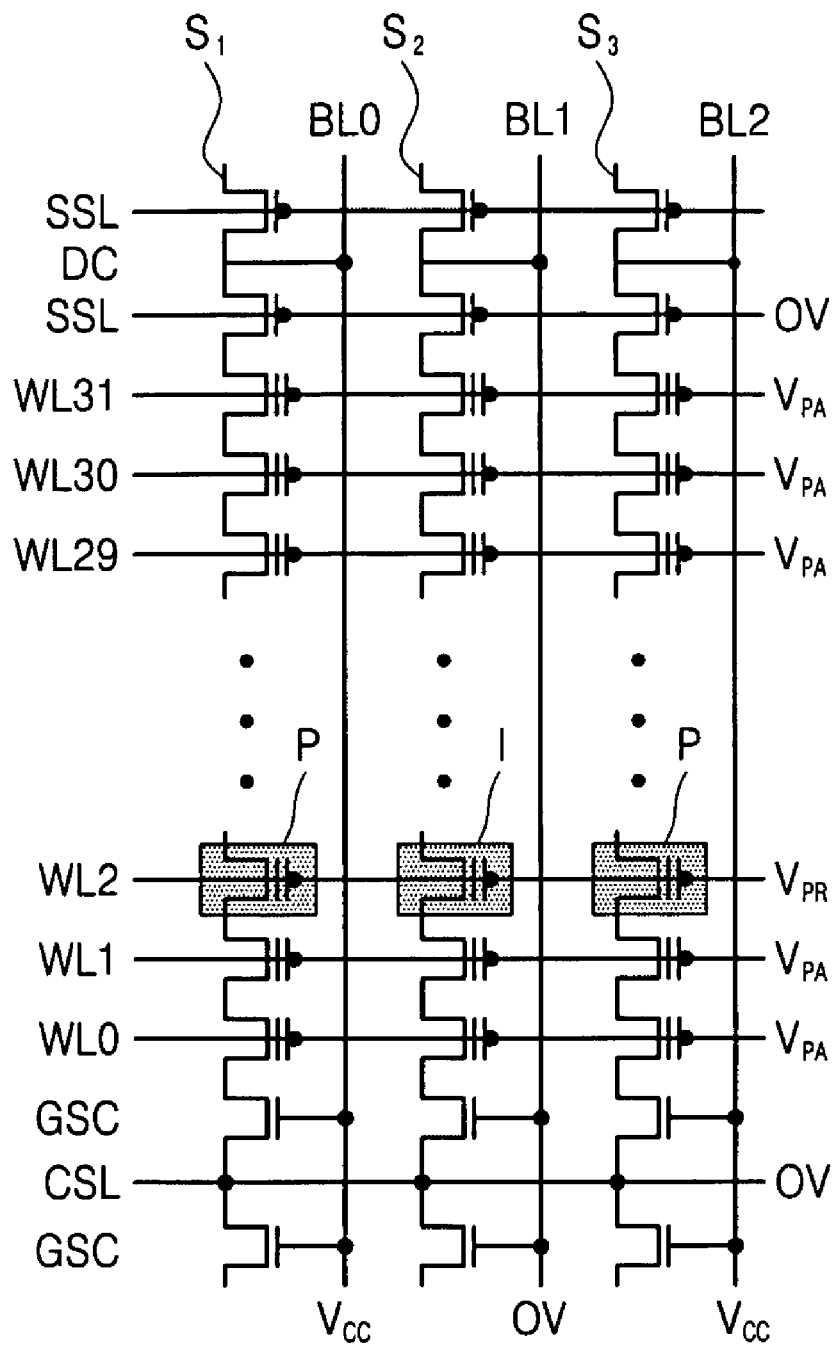
FIG. 11 is a circuit diagram for illustrating programming of the example non-volatile memory device of FIG. 10.

FIG. 11 is a circuit diagram for illustrating a programming method for a non-volatile memory device according to an example embodiment. The method shown in FIG. 11 may be used to program example embodiments of non-volatile memory devices such as the non-volatile memory device shown in FIG. 10.

Referring to FIG. 11, data may be programmed in the memory transistors Tm of selected bit lines BL0 and BL2, and programming of the data on the memory transistors Tm of an unselected bit line BL1 may be suppressed and/or prevented. For example, data may be programmed on the memory transistors Tm of a first group P located on the third word line WL2 from the bottom of the bit lines BL0 and BL2. However, the data programming in the memory transistor Tm of a second group I may be suppressed and/or prevented.

For example, an operation voltage Vcc may be applied to the selected bit lines BL0 and BL2, and a ground voltage (e.g., about 0 V) may be applied to the unselected bit line BL1. The ground voltage may also be applied to the string select line SSL and the common source line CSL. A program voltage $V_{PR}$ may be applied to the selected word line WL2, and a pass voltage $V_{P4}$ may be applied to the other word lines WL0, WL1, WL3, ..., WL29, WL30, and WL31. The program voltage $V_{PR}$ may be a voltage sufficient (e.g., high enough) to tunnel charges, for example, between about 15V and 20V, inclusive. The pass voltage $V_{PA}$ may be selected without allowing for the tunneling of the charges while turning on (e.g., activating) the memory transistors Tm.

According to this selection, the ground select transistors $T_{GS}$ of the NAND strings S0 and S2 connected to the selected bit lines BL0 and BL2 may be turned on (e.g., activated). Therefore, the ground voltage of the common source line CSL may be applied to the NAND strings S0 and S2. Thus, the data may be stored in the memory transistors Tm of the first group P coupled to the selected word line WL2 and the NAND strings S0 and S2. However, the ground select transistor $T_{GS}$ of the NAND string S1 connected to the unselected bit line BL1 may be turned-off (e.g., deactivated). Consequently, the NAND string S1 may be floated, and thus, the data storage on the memory transistor Tm of the second group I coupled to the selected word line WL2 and the NAND string S1 may be suppressed and/or prevented. For example, because the NAND string S1 is floated, the free electron may not be supplied to the second source and drain regions 145a of FIG. 3 of the memory transistors Tm of the second group I. Thus, the efficiency of the programming suppression may increase.

Programming with respect to the memory transistors Tm of the above-mentioned first group P and the programming suppression operation with respect to the memory transistor Tm of the second group I may be similarly applied to other memory transistors Tm.

Figure 12:
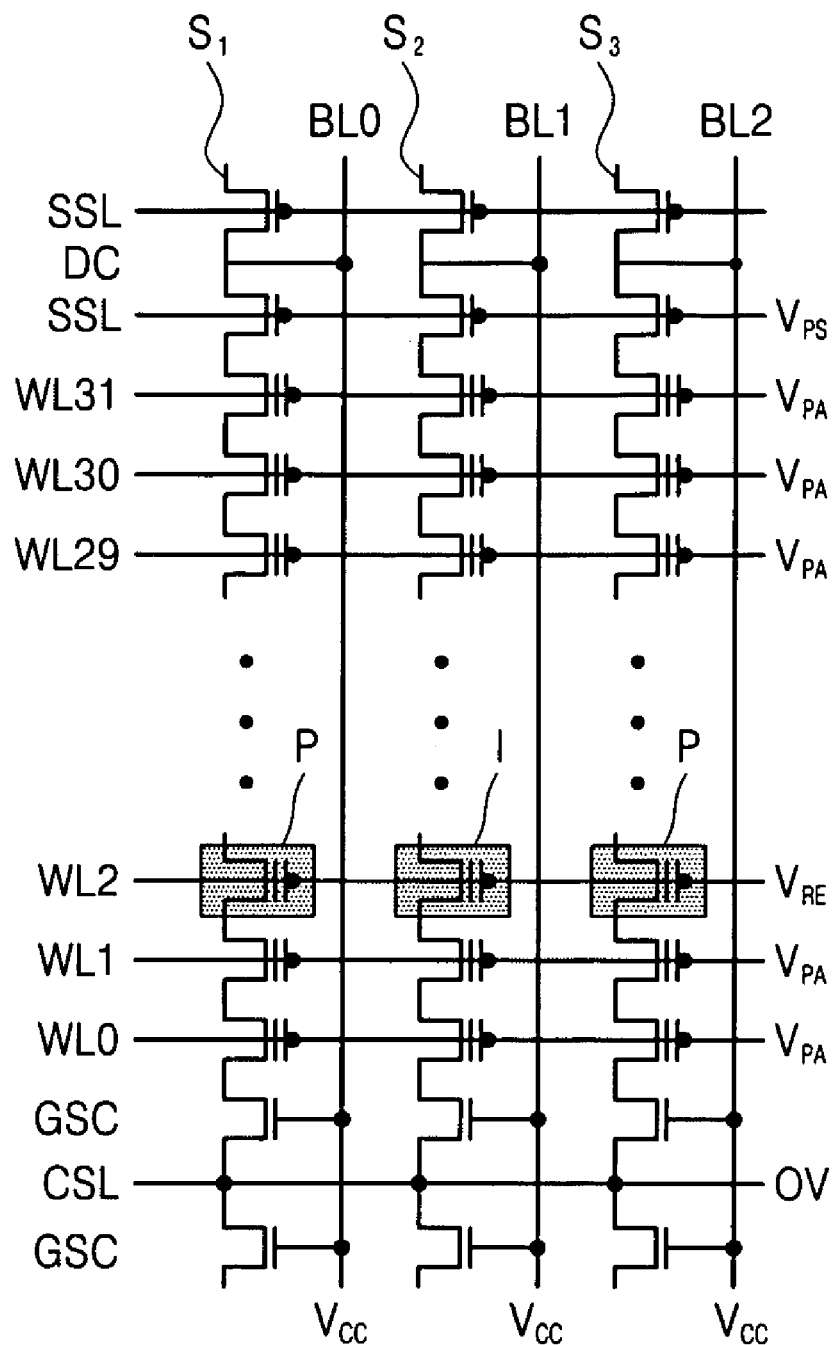
FIG. 12 is a circuit diagram for illustrating reading of the example non-volatile memory device of FIG. 10.

FIG. 12 is a circuit diagram for illustrating a reading method for a non-volatile memory device according to an example embodiment. The method shown in FIG. 12 may be used to read data from the non-volatile memory device 300 of FIG. 10.

Referring to FIG. 12, the data state stored in the memory transistors Tm of the bit lines BL0, BL1 and BL2 may be read out. For example, the data state of the memory transistors Tm of the first group P and the second group I located on the third word line WL2 from the bottom of the bit lines BL0, BL1 and BL2 may be read out.

For example, an operational voltage Vcc may be applied to the bit lines BL0, BL1, and BL2, and a ground voltage (e.g., about 0V) may be applied to the common source select line CSL. A readout voltage $V_{RE}$ may be applied to the selected word line WL2, and a pass voltage $V_{PA}$ may be applied to the other word lines WL0, WL1, WL3, ..., WL29, WL30, and WL31. A turn-on (e.g., activation) voltage $V_{PS}$ may be applied to the string select line SSL. The read voltage $V_{RE}$ may be appropriately selected to distinguish the programming state and the erasing state.

The memory transistors Tm of the first group P may have a threshold voltage higher than the read voltage $V_{RE}$, and thus, may be turned-off (e.g., deactivated). However, the memory transistors Tm of the second group I have a threshold voltage lower than the read voltage $V_{RE}$, which as a result, may be turned-on (e.g., activated). Accordingly, by measuring a current flowing through the bit lines BL0, BL1, and BL2, the data state of the memory transistors Tm may be read out.

The data reading of the memory transistors Tm of the above-described first group P and the second group I may be similarly applied to the other memory transistors Tm.

Figure 13:
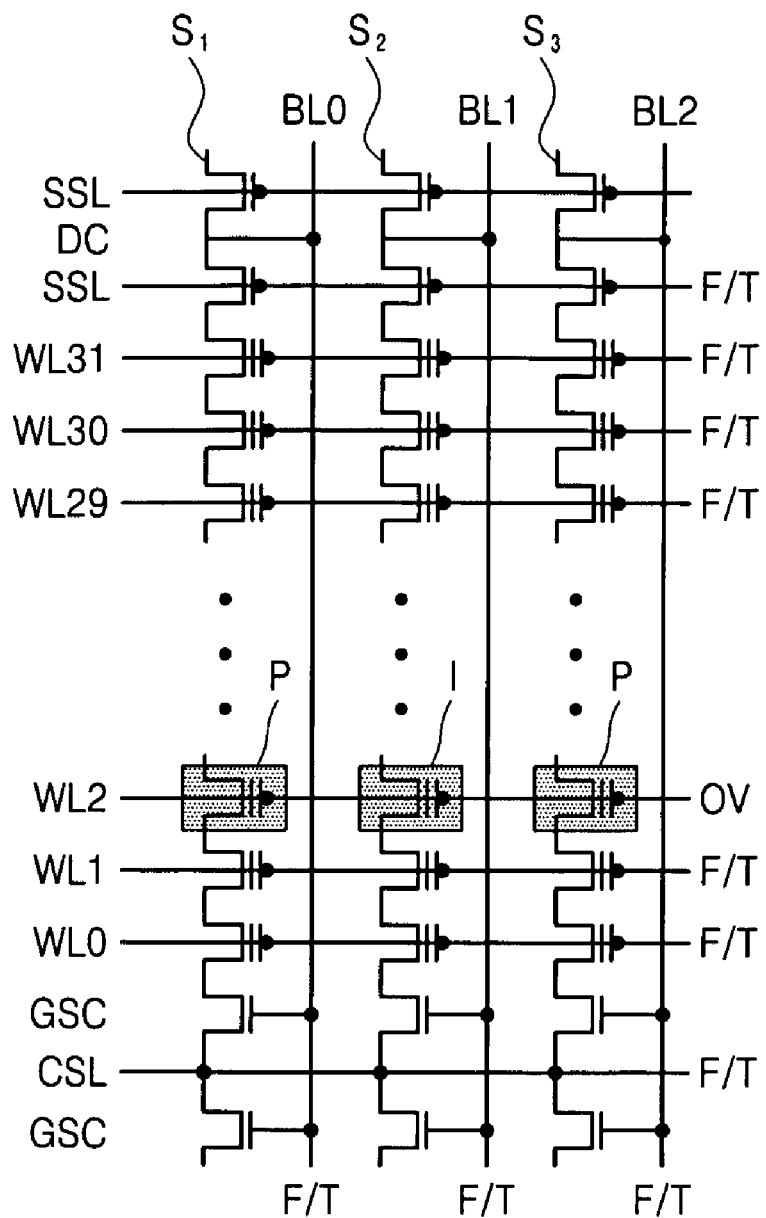
FIG. 13 is a circuit diagram for illustrating erasing of the example non-volatile memory device of FIG. 10.

FIG. 13 is a circuit diagram for illustrating an erasing method for a non-volatile memory device according to an example embodiment. The method shown in FIG. 13 may be used to erase the non-volatile memory device of FIG. 10.

Referring to FIG. 13, the data stored in the memory transistors Tm of the bit lines BL0, BL1, and BL2 may be erased. For example, the data of the memory transistors Tm of the first group P and the second group I located on the third word line WL2 from the bottom of the bit lines BL0, BL1, and BL2 may be erased.

For example, the bit lines BL0, BL1, and BL2, the common source select line CSL, and the group select line SSL may be floated (denoted by F/T). The ground voltage of about 0V may be applied to the selected word line WL2, and the other word lines WL0, WL1, WL3, ..., WL29, WL30, and WL31 may be floated (denoted by F/T). An erase voltage $V_{ER}$ may be applied to a body, for example, the semiconductor substrate 105 of FIG. 3, of the memory transistors Tm. For example, the erase voltage $V_{ER}$ may be about 20V to allow for tunneling of charges.

Erasing with respect to the memory transistors Tm of the above-stated first group P and the second group I may be similarly applied to the other memory transistors Tm. Moreover, block erasing of erasing data of the memory transistors Tm at a time may be performed using a similar method.

In non-volatile memory devices according to example embodiments, a programming suppression operation may be realized without utilizing channel boosting. As a result, transistor damage (e.g., damage of the outermost transistors) may be suppressed and/or prevented, and thus, program and read-out windows may be secured while suppressing and/or blocking short channel effects. Therefore, reliability of the non-volatile memory device may improve.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A non-volatile memory device comprising:
    at least one NAND string structure, the at least one NAND string structure including,
        a NAND string having a plurality of memory transistors arranged on a semiconductor substrate;
        a string select transistor disposed on the semiconductor substrate at a first end of the NAND string;
        a ground select transistor disposed on the semiconductor substrate at a second end of the NAND string; and
        a bit line electrically connected to the semiconductor substrate and a gate electrode of the ground select transistor.

2. The non-volatile memory device of claim 1, wherein the bit line and the gate electrode of the ground select transistor are electrically connected by a contact plug on the semiconductor substrate.

3. The non-volatile memory device of claim 1, wherein the bit line is connected to first source and drain regions disposed outside of the string select transistor in the semiconductor substrate.

4. The non-volatile memory device of claim 3, further including,
    a common source line disposed outside of the ground select transistor and electrically connected to first source and drain regions disposed outside of the ground select transistor, the first source and drain regions being disposed in the semiconductor substrate.

5. The non-volatile memory device of claim 1, further including,
    a common source line disposed outside of the ground select transistor and electrically connected to the semiconductor substrate.

6. The non-volatile memory device of claim 1, wherein each of the plurality of memory transistors includes, a charge storage layer formed on the semiconductor substrate and a control gate electrode formed on the charge storage layer.

7. The non-volatile memory device of claim 1, further including,
a second source and drain region defined in the semiconductor substrate between each adjacent memory transistor, the second source and drain regions being formed by an electrical field effect caused by fringe fields.

8. The non-volatile memory device of claim 7, wherein a second source and drain region is also defined between the NAND string and the string select transistors.

9. The non-volatile memory device of claim 7, wherein a second source and drain region is also defined between the NAND string and the ground select transistors.

10. The non-volatile memory device of claim 7, wherein a first source and drain region is defined in the semiconductor substrate between the NAND string and the string select transistor, and between the NAND string and the ground select transistor.

11. The non-volatile memory device of claim 1, further including,
a block select transistor disposed on the semiconductor substrate outside of the string select transistor.

12. The non-volatile memory device of claim 11, wherein the bit line is disposed outside of the block select transistor and electrically connected to the semiconductor substrate.

13. A non-volatile memory device comprising,
a plurality of bit lines and a plurality of word lines on the semiconductor substrate, and
a plurality of the NAND string structures of claim 1 arranged in a NAND string array structure, wherein each of the plurality of bit lines is electrically connected to the semiconductor substrate arranged outside of the plurality of select transistors and each gate electrode of the plurality of ground select transistors.

14. The non-volatile memory device of claim 13, wherein the plurality of ground select transistors are arranged on a plurality of NAND strings, and are electrically isolated from one another.

15. The non-volatile memory device of claim 13, wherein the plurality of bit lines are connected to the first source and drain region formed by doping impurities into the semiconductor substrate disposed outside of the plurality of string select transistors.

16. The non-volatile memory device of claim 13, wherein a second source and drain region is formed by an electrical field effect caused by fringe fields between each adjacent pair of memory transistors.

17. The non-volatile memory device of claim 16, wherein the second source and drain regions are further defined between each NAND string and each corresponding string select transistor, and between each NAND string and each corresponding ground select transistor.

18. The non-volatile memory device of claim 13, further including,
a plurality of block select transistors arranged on the semiconductor substrate disposed outside of the plurality of string select transistors.

19. The non-volatile memory device of claim 18, further including,
a block select line coupled to the plurality of block select transistors.

20. The non-volatile memory device of claim 13, further including,
a string select line coupled to the plurality of string select transistors.

21. The non-volatile memory device of claim 13, further including,
a plurality of word lines coupled to the plurality of memory transistors.

22. A method of operating a non-volatile memory device including a NAND string structure, the method comprising:
storing data on at least one of a plurality of memory transistors by turning-off a string select transistor, and applying an operation voltage to a bit line to turn-on a ground select transistor, the plurality of memory transistors being arranged in a NAND string on a semiconductor substrate, the NAND string being part of the NAND string structure; wherein
the string select transistor is disposed on the semiconductor substrate at a first end of the NAND string,
the ground select transistor is disposed on the semiconductor substrate at a second end of the NAND string, and
the bit line is electrically connected to the semiconductor substrate and a gate electrode of the ground select transistor.

23. The method of claim 22, further including,
grounding a common source line connected to the ground select transistor when storing the data.

24. The method of claim 22, further including,
first applying a program voltage to at least one of control gate electrodes of the plurality of memory transistors, and
second applying a pass voltage to remaining ones of the control gate electrodes, wherein
the first and second applying are performed concurrently with the storing.

25. The method of claim 22, further including,
reading data stored in the plurality of memory transistors by turning-on the string select transistor, and applying an operation voltage to the bit lines to turn-on the ground select transistor.

26. The method of claim 25, further including,
grounding a common source line connected to the ground select transistor when reading.

27. The method of claim 25, further including,
first applying a read voltage to one of control gate electrodes of the plurality of memory transistors, and
second applying a pass voltage is applied to remaining ones of the control gate electrodes, wherein
the first and second applying are performed concurrently with the reading.

28. The method of claim 22, further including,
erasing data stored in the plurality of memory transistors by grounding at least one of a control gate electrodes of the plurality of memory transistors, and applying an erase voltage to the semiconductor substrate.

29. A method of operating a non-volatile memory device including a NAND string structure, the method comprising:
preventing, when storing the data, storage of data in a plurality of memory transistors by turning-off a string select transistor, and grounding bit lines to turn-off a ground select transistor, the plurality of memory transistors being arranged in a NAND string on a semiconductor substrate, the NAND string being part of the NAND string structure; wherein
the string select transistor is disposed on the semiconductor substrate at a first end of the NAND string,
the ground select transistor is disposed on the semiconductor substrate at a second end of the NAND string, and the bit line is electrically connected to the semiconductor substrate and a gate electrode of the ground select transistor.

30. The method of claim 29, further including, applying a program voltage to at least one control gate electrode of the plurality of memory transistors when preventing.

31. The method of claim 29, further including, grounding a common source line connected to the ground select transistor when preventing.

\* \* \* \* \*